United States Patent [19]

Komuro et al.

[11] 4,039,866
[45] Aug. 2, 1977

[54] THYRISTOR CONTROL APPARATUS

[75] Inventors: Katsu Komuro; Seiya Shima; Sadao Hokari, all of Katsuta, Japan

[73] Assignee: Hitachi, Ltd., Japan

[21] Appl. No.: 663,864

[22] Filed: Mar. 4, 1976

[30] Foreign Application Priority Data

Mar. 7, 1975 Japan .................................. 50-27185

[51] Int. Cl.² ...................... H03K 17/68; H03K 17/72
[52] U.S. Cl. ........................... 307/252 N; 307/252 T;
 307/314; 363/130; 323/22 SC; 323/24; 323/34;
 323/36
[58] Field of Search .................. 307/252 N, 262, 268,
 307/252 T, 314; 323/22 SC, 24, 34, 36; 321/16,
 18, 47

[56] References Cited

U.S. PATENT DOCUMENTS

| 3,041,472 | 6/1962 | Ingman | 307/260 |
| 3,333,178 | 7/1967 | Van Allen et al. | 307/262 |
| 3,348,129 | 10/1967 | Schonholzer | 307/262 |
| 3,546,567 | 12/1970 | Shimp | 323/22 SC |

Primary Examiner—John Zazworsky
Assistant Examiner—Marcus S. Rasco
Attorney, Agent, or Firm—Craig & Antonelli

[57] ABSTRACT

A magnetic phase shifter utilizing the principle of magnetic amplifier is used as a phase shifter for applying a firing signal to a main thyristor. In order to amplify and sharpen the rise of the output pulse of the magnetic phase shifter, an auxiliary thyristor is fired by the output pulse of the magnetic phase shifter. The gate-cathode circuit of the main thyristor is connected to the auxiliary thyristor as a load thereof. Power for the auxiliary thyristor is obtained from an AC power supply which is in phase with the main thyristor through a transformer, while power for the magnetic phase shifter is introduced from an intermediate tap of the secondary winding of the transformer, thus making the magnetic phase shifter compact as well as low in cost.

7 Claims, 3 Drawing Figures

THYRISTOR CONTROL APPARATUS

The present invention relates to a thyristor control apparatus for effecting the phase control of thyristors by means of magnetic phase shifters.

A magnetic phase shifter, as is well known, relies on an application of the principle of a magnetic amplifier for its operation and has at least a saturable magnetic core, an AC winding (also called an output winding) and a control winding. When the AC winding is connected between an AC power supply and a load (for instance, a circuit between gate and cathode electrodes of a thyristor) and a DC voltage is applied to the control winding, the phase at which the magnetic core is saturated varies with the variations of the DC voltage. This fact is made use of to obtain an output voltage phase-controlled in relation to the load.

Such a magnetic phase shifter has a number of advantages as mentioned below, as compared with a phase shifter using a semiconductor device such as a transistor.

1. Highly reliable:

Operated in response to an average value of the input signals, it is not adversely affected by noise voltages. Besides, it is rugged in construction and long in life.

2. Controllable by a number of elements:

By providing a plurality of control windings, it is possible to apply a number of control inputs in insulated form. It is therefore very conveniently used in a control system using a number of elements requiring insulation.

For the above-mentioned reasons, the magnetic phase shifters find wide application as a thyristor control apparatus in fields requiring a high reliability.

In spite of this, the disadvantages of the magnetic phase shifter are its bulkiness and high cost. In controlling main thyristors in a high voltage circuit, power from an AC power supply common to the main thyristors is reduced to a level suitable as a voltage to be applied between the gate and the cathode of the main thyristors, and a pulse voltage phase-controlled by the magnetic phase shifters is applied between the gate and the cathode of the main thyristors. Even the voltage required between the gate and the cathode of the main thristors, however, is still too high, often rendering the magnetic phase shifters bulky and expensive.

Also, since any output voltage of the magnetic phase shifters having a sharp rise cannot be obtained, there are some cases in which the output of the magnetic phase shifters is used to fire auxiliary thyristors so that the main thyristors are fired by means of the output voltage of the auxiliary thyristors. In such cases, the voltage required between the gate and the cathode of the main thyristors to which the power from the AC power supply for the main thyristors is reduced through a transformer is used as a power supply for the auxiliary thyristors. A common power supply is used for the magnetic phase shifters and the auxiliary thyristors, and for the above-mentioned reasons, the magnetic phase shifters are bulky and high in cost.

It is not expedient to provide a transformer only for the purpose of rendering the magnetic phase shifters compact and low in cost.

Accordingly, it is a primary object of the present invention to provide a thyristor control apparatus capable of reducing the size and cost of the magnetic phase shifters.

According to the present invention, there is provided a thyristor control apparatus comprising a transformer means, a primary circuit means and at least one secondary circuit means, the primary circuit means including a primary winding of the transformer means to be connected to an AC power supply, the secondary circuit means including a secondary winding of the transformer means, a thyristor, a load connected to the secondary winding through the thyristor, and a magnetic phase shifter for effecting phase control of the thyristor, the magnetic phase shifter having at least a saturable magnetic core, an AC winding and a control winding, the AC winding being connected between a gate terminal of the thyristor and an intermediate tap provided at a given point of the secondary winding.

The intermediate tap should be positioned at a suitable point of optimum voltage for the magnetic phase shifter. Further, the load of the thyristor mentioned above may be a circuit between the gate and cathode electrodes of another thyristor of larger capacity than the first mentioned thyristor.

By constructing the apparatus this way, it is possible to realize a compact and low-cost magnetic phase shifter which is operated at a low voltage.

The above and other objects, features and advantages will be made apparent by the detailed description taken in conjunction with the accompanying drawings, in which.

Figure 1:
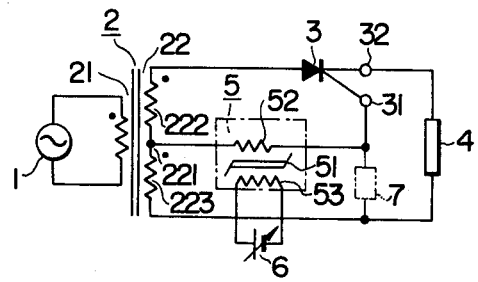
FIG. 1 is a diagram showing a single-phase half-wave thyristor control apparatus as an embodiment of the present invention.

First, the single-phase half-wave thyristor control apparatus constituting a fundamental form of the present invention will be described with reference to FIG. 1.

A single-phase AC power supply 1 is connected to the primary winding 21 of a transformer 2. The secondary winding 22 of the transformer 2 is connected through a thyristor 3 to a load 4. A magnetic phase shifter 5 is provided for controlling the thyristor 3. The magnetic phase shifter 5 is composed of a saturable magnetic core 51, an AC winding (also called an output winding) 52 wound on the magnetic core 51, and a control winding 53 also wound on the magnetic core 51. The secondary winding 22 of the transformer 2 has an intermediate tap 221 at a given point on it and is divided into winding sections 222 and 223. The AC winding 52 of the magnetic phase shifter 5 is inserted between the intermediate tap 221 and a gate terminal 31 of the thyristor 3, while the control winding 53 is connected to a DC control voltage source 6.

The voltage across the secondary winding 22 of the transformer 2 is determined according to the voltage required of the load 4. The intermediate tap 221 is positioned at such a point and the voltage across the winding section 223 is determined in such a manner as to suit the voltage between the gate terminal 31 and the cathode terminal 32, required of the thyristor 3. In the negative half cycle of the AC power supply 1, the magnetic core 51 is reset by the control input derived from the control voltage source 6 thereby to determine the saturation point for the next positive half cycle. When the saturable magnetic core 51 is saturated, the impedance of the AC winding 52 is sharply reduced, so that the voltage across the winding section 223 causes a current to flow in the closed circuit consisting of the elements 223, 221, 52, 31, 32 and 4, thereby firing the thyristor 3. For practical purposes, it is advisable to provide a load resistor 7 so that the voltage across the resistor 7 may be applied to the series circuit constituted by the cathode 32 and the gate 31 of the thyristor 3 and the load 4. In this way, the voltage of the DC control voltage source 6 is regulated, thus making it possible to supply a half-wave rectified voltage according to the regulated voltage to the load 4. As a result, a small voltage across the winding portion 223 may be selected, while at the same time reducing the size and cost of the magnetic phase shifter 5.

Figure 2:
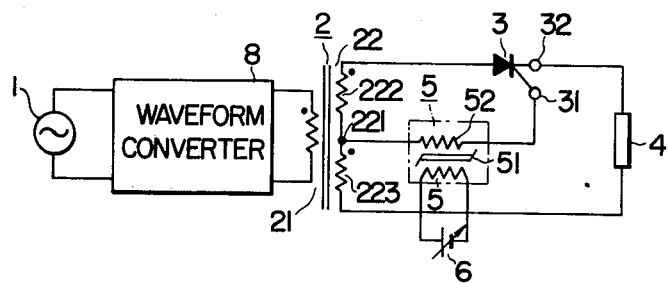
FIG. 2 is a diagram showing an improved single-phase half-wave thyristor control apparatus as another embodiment of the present invention.

An improvement in the single-phase half-wave thyristor control apparatus of FIG. 1 is shown in FIG. 2. In the control apparatus of FIG. 1, the voltage derived from the AC power supply 1 takes the form of a sine wave and therefore a gate voltage sufficiently high to fire the thyristor 3 cannot be obtained in the neighbourhood of the minimum or maximum phase angle. Also, voltage deviations of the AC power supply 1 cause the characteristics of the magnetic phase shifter 5 to change. Furhter, in view of the fact that it is impossible to obtain an exactly rectangular hysteresis curve of the magnetization characteristics of the magnetic core 51 of the magnetic phase shifter 5, the sine-wave alternating current with a gentle rise involves a considerably narrow maximum phase angle, In order to obviate these disadvantages, the control apparatus of FIG. 2 is such that a wave-form converter 8 is inserted between the AC power supply 1 and the primary winding 21 of the transformer 2 so as to supply an AC voltage having a rectangular waveform to the primary winding 21 of the transformer 2. The secondary circuit of this embodiment shown in FIG. 2 is quite the same as that of FIG. 1.

According to this configuration, the voltagetime product at the time of magnetic core saturation can be compensated for in a short period of time as compared with the case employing a sine-wave AC power supply, thus making possible a sufficiently large maximum phase angle and the output voltage of the phase shifter constant regardless of the phase angle.

The waveform converter 8 may include a DC power supply, by the stabilization of which any variations of the magnetic phase shifter characteristics may be prevented.

Figure 3:
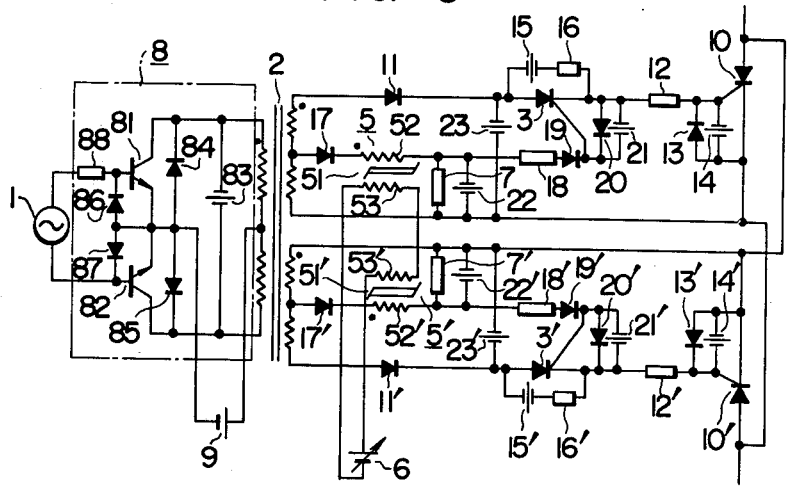
FIG. 3 is a diagram showing a single-phase full-wave thyristor control apparatus as still another embodiment of the present invention.

FIG. 3 shows a circuit diagram of an embodiment of the single-phase full-wave thyristor control apparatus in which reversely parallel-connected thyristors are phase-controlled.

A waveform converter 8 is made up of a transistor inverter. As is well known, by making a couple of transistors 81 and 82 conduct alternately in response to the voltage from the AC power supply 1, an AC voltage having a rectangular waveform is applied from a DC power supply 9 to the primary winding of a transformer 2. By the way, reference numeral 83 denotes a commutation capacitor, numerals 84 and 85 feed-back diodes, numerals 86 and 87 rectifying diodes and numeral 88 a resistor.

Reference numerals 10 and 10' denote main thyristors connected to each other in reverse-parallel for regulating the AC voltage. The reverse-parallelly connected thyristors 10 and 10' may be replaced by another couple of thyristors which are operated alternately in the rectifier circuit. In the embodiment under consideration, a couple of the thyristor control apparatuses shown in FIG. 2 are connected to the secondary side of the transformer 2 and are operated respectively in opposite half cycles to fire the main thyristors 10 and 10'. Thyristors 3 and 3' are used as auxiliary thyristors for pulse amplification and wave shaping. One of the two secondary windings of the transformer 2 is connected with the gate and cathode terminals of the thyristor 10 through a rectifying diode 11, the auxiliary thyristor 3 and a resistor 12. A parallel circuit of a diode 13 and a capacitor 14 is connected between the gate and cathode terminals of the main thyristor 10 to block a reverse voltage and a surge voltage. Between the anode and the cathode of the auxiliary thyristor 3, a series circuit of a capacitor 15 and a resistor 16 is connected to protect the element from a surge voltage. The intermediate tap of one of the secondary windings of the transformer 2 is connected, through a rectifier diode 17, to an end of an AC winding 52 of a magnetic phase shifter 5. The other end of the AC winding 52 is connected to the gate of the auxiliary thyristor 3 through a resistor 18 and a diode 19. A parallel circuit of a diode 20 and a capacitor 21 is also inserted between the gate and the cathode of the auxiliary thyristor 3. A load resistor 7 similar to that described with reference to FIG. 1 is connected to the output circuit of the magnetic phase shifter 5, so that the auxiliary thyristor 3 is fired by the voltage across the load resistor 7. The capacitor 22 is provided for the purpose of protecting the auxiliary thyristor 3 from erroneous firing, while the capacitor 23 is for speeding up the operation.

The same circuit as described above is also provided for the other of the two secondary windings of the transformer 2. In view of the coincident construction, like component elements are denoted by placing a dash after the numerals.

The transistor inverter 8 is excited by the AC power supply 1 in phase with the AC power supplied to the main thyristors 10 and 10', and therefore a rectangular wave voltage in phase with the AC power voltage applied to the main thyristors 10 and 10' is obtained at the respective secondary windings of the transformer 2. The magnitude of the voltage thus obtained is determined in accordance with a required gate current of the main thyristors 10 and 10'. The ratio of the required gate current to the rated forward current of the thyristor ranges approximately from 1/200 to 1/300 for large-capacity ones and from 1/50 to 1/100 for smaller-capacity thyristors. Accordingly, the rated current of each of the auxiliary thyristors 3 and 3' is small as compared with that for the main thyristors, as it is determined based on the above-mentioned ratio. Also, the required gate current for each of the auxiliary thyristors 3 and 3' is very small based on the above-mentioned ratio. For this reason, a very small output current of the phase shifters 5 and 5' may serve the purpose. A source voltage for the phase shifters sufficient to produce such a small output current may be derived through the intermediate tap of each of the secondary windings. Consequently, the magnetic phase shifters 5 and 5' may be greatly reduced in size, thereby facilitating the mounting thereof on the apparatus, while at the same time lowering the cost thereof.

If a power source of rectangular wave is used as a power supply for the magnetic phase shifters 5 and 5', it is possible to enlarge the width of phase control thereof by 20° C (electrical angle) or more. In addition, the gate voltage applied to the main thyristors 10 and 10' and the auxiliary thyristors 3 and 3' may be made constant regardless of the phase angle.

Further, by using a well-known stabilized DC power supply as the DC power supply 9, the characteristics of the magnetic phase shifters 5 and 5' may be stabilized.

Even though the time required for the auxiliary thyristors 3 and 3' to conduct is about 1 μs, it takes about 10 to 40 μs for the gate pulse of the main thyristors 10 and 10' to rise, because of the leakage reactance of the transformer 2. To improve this situation, the capacitors 23 and 23' are charged in advance and, simultaneously with the start of conduction of the auxiliary thyristors 3 and 3', discharged through the resistors 12 and 12' and the gates of the main thyristors 10 and 10', respectively. By doing so, a gate pulse with a short rise time is obtained.

The auxiliary thyristors 3 and 3', which are fired by a considerably small gate input, are easily affected by an erroneous firing pulse such as a surge voltage. Such an erroneous firing may be substantially prevented by the provision of the capacitors 22 and 22'.

Generally, a stray capacity exists between the AC windings 52 and 52' of the magnetic phase shifters 5 and 5', respectively and is concentrated at the ends of the windings. In the drawings, the starting points of windings are shown by the black dot marks. This condition is the same as if a capacitor of small capacitance is connected between the right-handed ends of the AC windings 52 and 52'. As a result, assuming that a forward voltage is applied to the main thyristor 10 which is off, a small current may flow through a path of the anode of the main thyristors 10, a part of the other secondary winding of the transformer 2, the diode 17', the AC winding 52', the stray capacitance, the resistor 7 and the cathode of the main thyristor 10 if the diode 17 should be short-circuited. This time period is associated with the operation of the magnetic phase shifter 5 and the resetting of the other magnetic phase shifter 5'. In spite of this, if the small current could flow due to the short ciruit of the diode 17 through the AC winding 52' of the magnetic phase shifter 5' in the reset state, the characteristics of the magnetic phase shifter 5' might be abnormal. This problem becomes more serious especially when reductance of capacity of the magnetic phase shifters is intended according to the present invention. During the opposite half cycle, the magnetic phase shifter 5 develops abnormal characteristics quite similarly. Each of the diodes 17 and 17' blocks the above-mentioned path of the small current due to stray capacitance to cause the small current due to stray capacitance to pass the path from the anode of the main thyristor 10 through the resistor 7', the stray capacitance and the resistor 7 to the cathode of the main thyristor 10. Thus, the small current due to stray capacitance is prevented from flowing through the respective AC windings 52, 52' of the magnetic shifters 5 and 5' to thereby stabilize the characteristics of the magnetic phase shifters 5 and 5'.

The control voltage source 6 is connected to the series-connected control windings 53 and 53', so that the same control current flows in the windings 53 and 53', thus making it possible to render the output phase angles of the magnetic phase shifters 5 and 5' coincident with each other.

What is claimed is:

1. A thyristor control apparatus comprising a transformer including a primary circuit and at least one secondary circuit, said primary circuit including a primary winding of said transformer to be connected to an AC power supply, said secondary circuit including a secondary winding of said transformer, a thyristor having a gate terminal to control the conduction thereof, a load connected across said secondary winding through said thyristor, and magnetic phase shifter means for effecting phase control of said thyristor, said magnetic phase shifter means including at least a saturable magnetic core, an AC winding and a control winding, said AC winding being connected between said gate terminal of said thyristor and an intermediate tap provided at a given point of said secondary winding.

2. A thyristor control apparatus according to claim 1, further comprising a waveform converter connected between the AC power supply and said primary winding of said transformer means, for generating a rectangular wave AC voltage in phase with the voltage of said AC power supply.

3. A thyristor control apparatus according to claim 1, in which said load is a gate-cathode circuit of a second thyristor having a larger current carrying capacity than said first thyristor.

4. A thyristor control apparatus according to claim 1, in which a couple of said secondary circuit means are provided, said two secondary means being the same to each other but being opposite in polarity.

5. A thyristor control apparatus according to claim 2, in which said waveform converter is a transistor inverter including a DC power supply and a couple of transistors alternately switched by the voltage of said AC power supply, for converting the voltage of said DC power supply into a rectangular AC voltage and supplying said rectangular AC voltage to said primary winding.

6. A thyristor control apparatus according to claim 4, in which the respective control windings of said magnetic phase shifters of said couple of secondary circuit means are connected in series and are supplied with a common control input voltage.

7. A thyristor control apparatus according to claim 6, in which said load of each of said couple of secondary circuit means is a second thyristor having a larger current carrying capacity than said first thyristor, said respective second thyrsitors of said couple of secondary circuit means being reverse-parallely connected.

* * * * *